United States Patent
Im et al.

(10) Patent No.: US 10,629,434 B2
(45) Date of Patent: Apr. 21, 2020

(54) LASER IRRADIATION INDUCED SURFACE PLANARIZATION OF POLYCRYSTALLINE SILICON FILMS

(71) Applicants: THE TRUSTEES OF COLUMBIA UNIVERSITY IN THE CITY OF NEW YORK, New York, NY (US); James S. Im, New York, NY (US); Miao Yu, New York, NY (US)

(72) Inventors: James S. Im, New York, NY (US); Miao Yu, New York, NY (US)

(73) Assignee: THE TRUSTEES OF COLUMBIA UNIVERSITY IN THE CITY OF NEW YORK, New York, NY (US)

( * ) Notice: Subject to any disclaimer, the term of this patent is extended or adjusted under 35 U.S.C. 154(b) by 0 days.

(21) Appl. No.: 15/546,914

(22) PCT Filed: Apr. 8, 2016

(86) PCT No.: PCT/US2016/026698
§ 371 (c)(1),
(2) Date: Jul. 27, 2017

(87) PCT Pub. No.: WO2016/164759
PCT Pub. Date: Oct. 13, 2016

(65) Prior Publication Data
US 2018/0019123 A1  Jan. 18, 2018

Related U.S. Application Data

(60) Provisional application No. 62/144,735, filed on Apr. 8, 2015.

(51) Int. Cl.
H01L 21/02 (2006.01)
B23K 26/03 (2006.01)
(Continued)

(52) U.S. Cl.
CPC ........ H01L 21/02686 (2013.01); B23K 26/03 (2013.01); B23K 26/0622 (2015.10);
(Continued)

(58) Field of Classification Search
CPC ......... H01L 21/02595; H01L 21/02074; H01L 21/32115; H01L 21/02532;
(Continued)

(56) References Cited

U.S. PATENT DOCUMENTS 6,677,222 B1   1/2004   Mishima et al.
7,259,081 B2   8/2007   Im
(Continued)

FOREIGN PATENT DOCUMENTS

EP   1294015 A1 *   3/2003   ............. H01L 21/28

OTHER PUBLICATIONS

Bosseboeuf et al., "Planarization of rough silicon surfaces by laser annealing," Applied Surface Science, 109/110, pp. 473-476 (1997).
(Continued)

*Primary Examiner* — Jasmine J Clark
(74) *Attorney, Agent, or Firm* — Wilmer Cutler Pickering Hale and Dorr LLP

(57) ABSTRACT

A method for planarizing excimer laser annealed (ELA) polycrystalline thin films via irradiation. The method includes providing an ELA thin film having an oxide and a top surface with a first surface roughness defined at least by a first plurality of protrusions. The ELA thin film is etched to substantially remove the oxide. At least a portion of the etched ELA thin film is then irradiated using a short-pulse duration excimer laser beam, to form an irradiated thin film with a second surface roughness defined at least by a second plurality of protrusions. The second surface roughness is lower than the first surface roughness.

20 Claims, 13 Drawing Sheets

(51) Int. Cl.
     *B23K 26/0622* (2014.01)
     *B23K 26/354* (2014.01)
     *H01L 21/321* (2006.01)
     *H01L 21/302* (2006.01)
     *B23K 101/40* (2006.01)
     *B23K 103/00* (2006.01)
     *B23K 103/08* (2006.01)

(52) U.S. Cl.
     CPC ........ *B23K 26/0624* (2015.10); *B23K 26/354* (2015.10); *H01L 21/02074* (2013.01); *H01L 21/02532* (2013.01); *H01L 21/02587* (2013.01); *H01L 21/02595* (2013.01); *H01L 21/302* (2013.01); *H01L 21/32115* (2013.01); *B23K 2101/40* (2018.08); *B23K 2103/08* (2018.08); *B23K 2103/56* (2018.08)

(58) Field of Classification Search
     CPC ......... H01L 21/02686; H01L 21/02587; H01L 21/302; B23K 26/0622; B23K 26/354; B23K 26/0624; B23K 2103/08; B23K 2101/40; B23K 2103/56; B23K 26/03
     See application file for complete search history.

(56) References Cited

U.S. PATENT DOCUMENTS

| | | |
|---|---|---|
| 7,704,862 B2 | 4/2010 | Im et al. |
| 2004/0142582 A1 | 7/2004 | Crowder et al. |
| 2004/0248345 A1 | 12/2004 | Chang |
| 2006/0043072 A1 | 3/2006 | Chen et al. |
| 2006/0213880 A1* | 9/2006 | Tanaka ..................... G02B 1/11 219/121.69 |
| 2011/0049764 A1* | 3/2011 | Lee ..................... B23K 26/0604 264/400 |
| 2012/0048371 A1* | 3/2012 | Choi ..................... H01L 31/0747 136/258 |

OTHER PUBLICATIONS

Brotherton, "Polycrystalline silicon thin film transistors," Semiconductor Science and Technology, 10, pp. 721-738 (1995).

Fork et al., "Capillary waves in pulsed excimer laser crystallized amorphous silicon," Applied Physics Letters, 68, 2138-2140 (1996).

Im et al., "Controlled Super-Lateral Growth of Si Films for Microstructural Manipulation and Optimization," Physica Status Solidi (a), 166, pp. 603-617 (1998).

Im and Kim, "On the super lateral growth phenomenon observed in excimer laser-induced crystallization of thin Si films," Applied Physics Letters, 64, pp. 2303-2305 (1994).

International Search Report and Written Opinion for PCT Application No. PCT/US16/26698 dated Jul. 5, 2016 (15 pages).

Kim and Im, "Multiple Pulse Irradiation Effects in Excimer Laser-Induced Crystallization of Amorphous Si Films," Mat. Res. Soc. Symp. Proc., 321, 665-670 (1994).

Wang et. al., "Observation of Superheating of Si at the Si/SiO$_2$ Interface in Pulsed-laser irradiated Si Thin Films," Mater. Res. Soc. Symp. Proc., 1770, pp. 43-48 (2015).

* cited by examiner

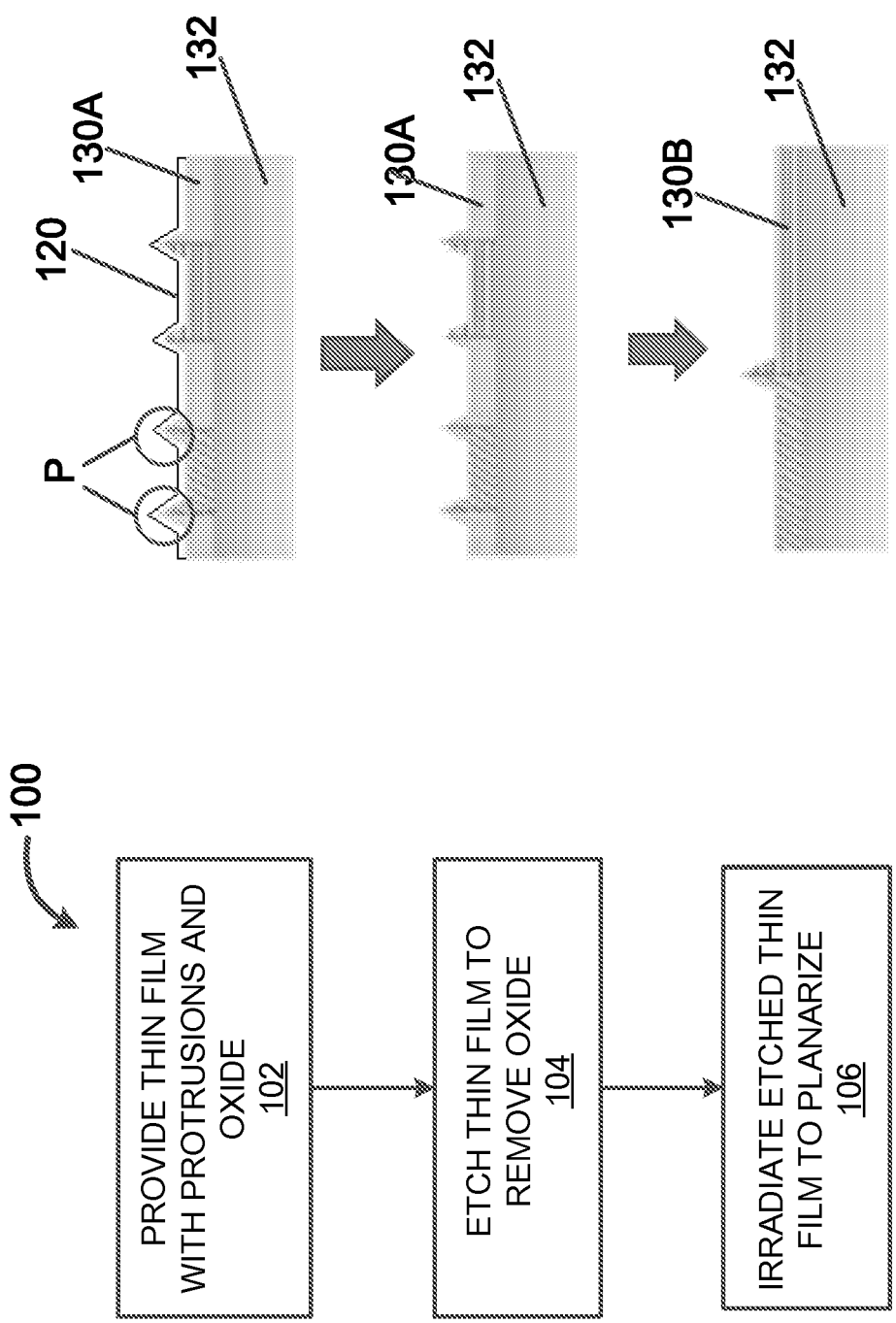

FIG. 9A
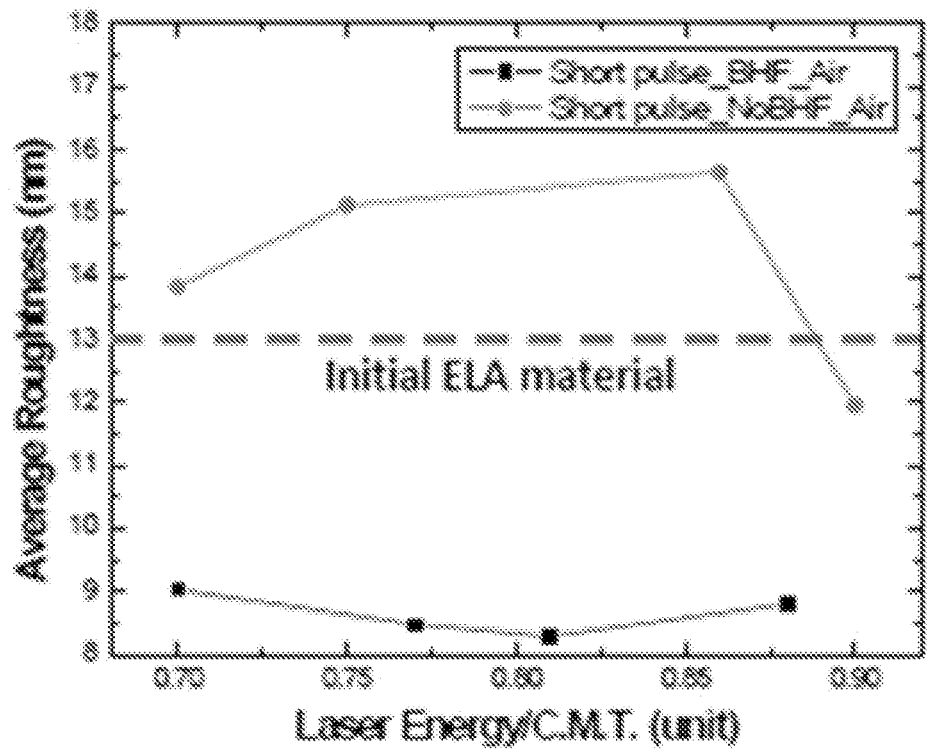
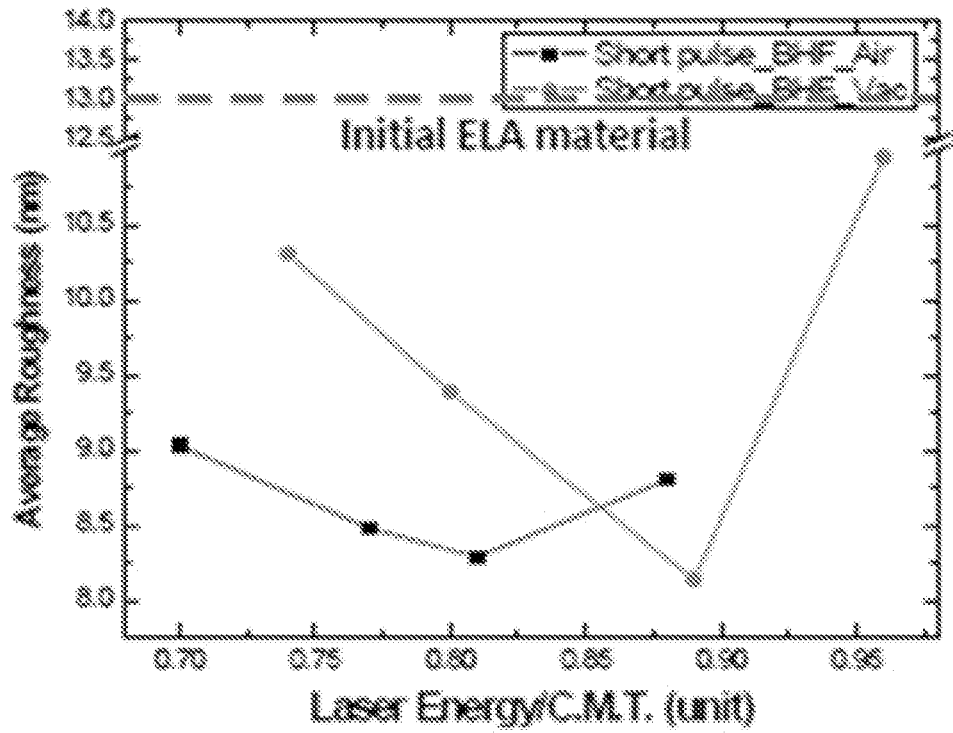
FIG. 9B

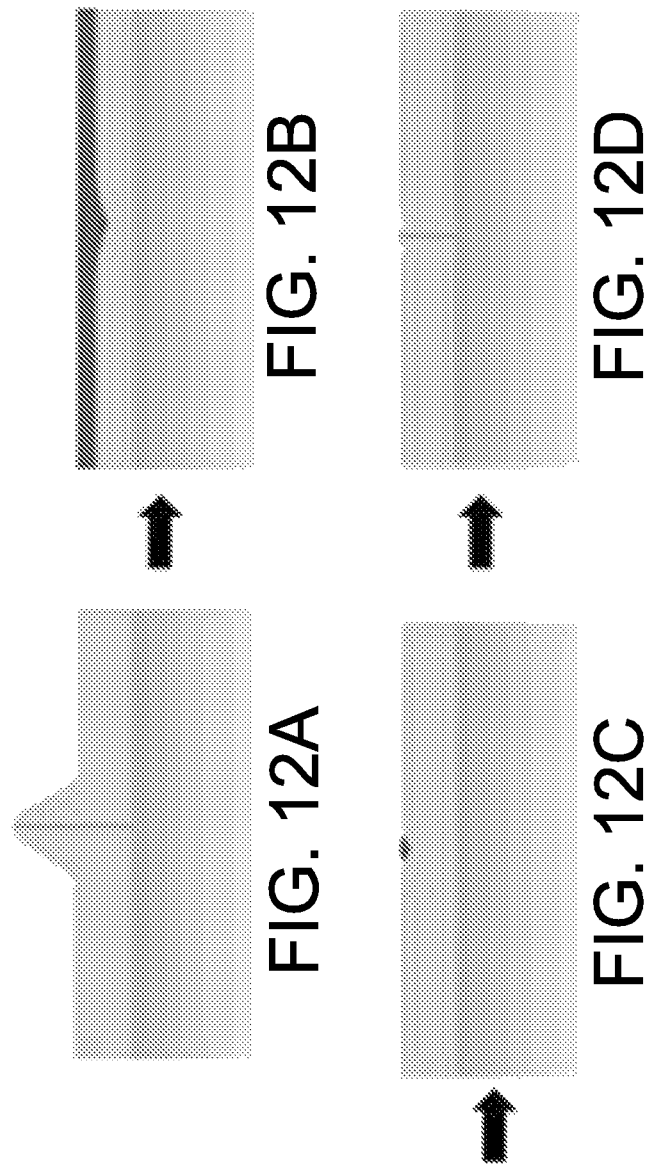

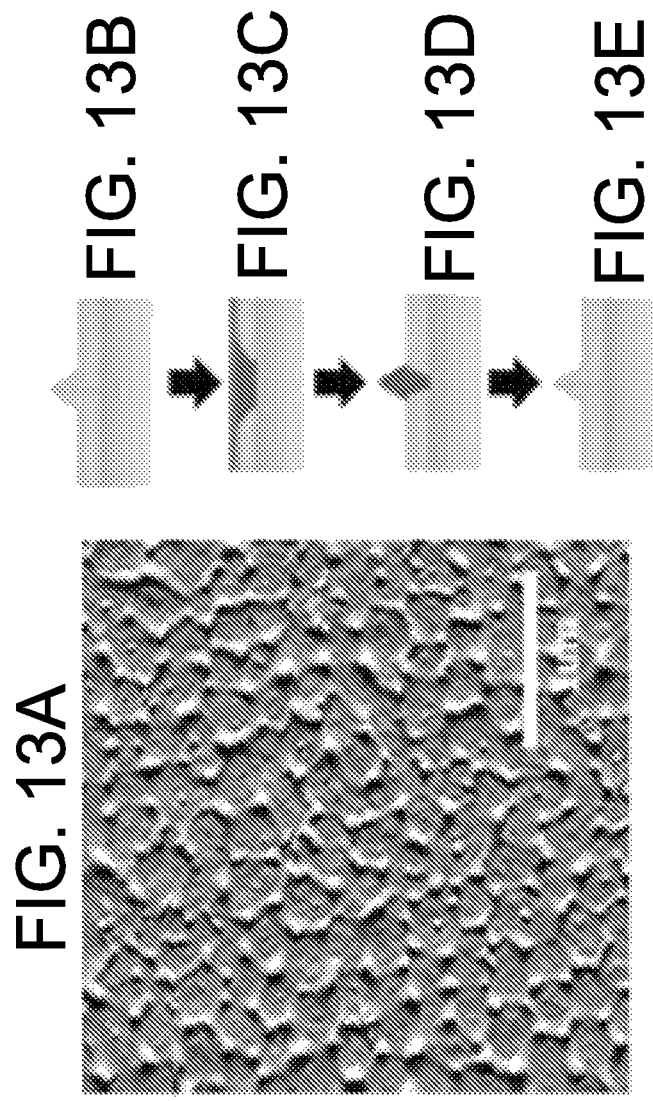

US 10,629,434 B2

LASER IRRADIATION INDUCED SURFACE PLANARIZATION OF POLYCRYSTALLINE SILICON FILMS

CROSS-REFERENCE TO RELATED PATENT APPLICATIONS

This application is a U.S. National Phase Application under 35 U.S.C. § 371 of International Patent Application No. PCT/US16/26698, filed Apr. 8, 2016 and titled "Laser Irradiation Induced Surface Planarization of Polycrystalline Silicon Films," the contents of which are hereby incorporated by reference, which claims the benefit under 35 U.S.C. § 119(e) of U.S. Provisional Patent Application No. 62/144,735, filed Apr. 8, 2015 and titled "Laser Irradiation Induced Surface Planarization of ELA-Processed Polycrystalline Si Films," the contents of which are hereby incorporated by reference in their entirety.

FIELD OF THE DISCLOSURE

The present application relates to thin film processing. More particularly, the present application relates to post-processing of polycrystalline thin films.

BACKGROUND

Excimer laser annealing (ELA) is a technique that can be used to convert a thin film of amorphous silicon ("a-Si") into a polycrystalline silicon (polysilicon) film, for example, having a grain size of about 308 nm, without heating the underlying substrate. During ELA, a pulsed excimer laser beam is scanned across an amorphous silico surface, causing it to melt and then crystallize during cooling. A drawback of ELA-generated films is that they include high densities of surface protrusions. Other polycrystalline films can also include high densities of surface protrusions. These protrusions can have undesirable effects on the performance of electronic devices such as thin film transistors (TFTs), in which such films can be used. Given increasing needs to fabricate higher performance TFTs for future products, such as advanced active-matrix organic light-emitting diode (AMOLED) displays, a method of efficiently and uniformly planarizing polycrystalline thin films are therefore desirable.

SUMMARY

In accordance with certain embodiments, a method for processing a film can include providing a film including a polycrystalline thin film having a top surface having a first surface roughness defined by a first plurality of protrusions and an oxide layer over the top surface of the thin film. The method can also include etching the film to substantially remove the oxide layer and irradiating a portion of the etched film using a short-pulse duration laser beam with controlled energy density to cause partial melting to the portion of the etched film, to form an irradiated polycrystalline thin film having a second surface roughness defined by a second plurality of protrusions wherein the second surface roughness is lower than the first surface roughness.

In accordance with certain embodiments, the film is an excimer laser annealed (ELA) film.

In accordance with certain embodiments, the portion of the etched film is irradiated using at least one of an excimer laser, a solid-state laser, a rapidly scanned continuous wave laser, and a rapidly scanned quasi-continuous wave laser that provides laser energy to cause partial melting to the polycrystalline thin film below the near complete melting threshold.

In accordance with certain embodiments, the irradiating comprises directing a single pulse of the laser beam toward the etched film.

In accordance with certain embodiments, the irradiating comprises directing a plurality of pulses of the laser beam toward the etched film.

In accordance with certain embodiments, the oxide layer is at least one of a deposited oxide and a native oxide.

In accordance with certain embodiments, the second surface roughness is at least 50% lower than the first surface roughness.

In accordance with certain embodiments, the second surface roughness is at least 10% lower than the first surface roughness.

In accordance with certain embodiments, the second surface roughness is lower than about 50 nm.

In accordance with certain embodiments, etching the film comprises exposing the film to hydrofluoric acid (HF).

In accordance with certain embodiments, etching the film comprises exposing the film to a plasma.

In accordance with certain embodiments, wherein the excimer laser beam has a pulse width of no more than 200 ns.

In accordance with certain embodiments, a method for processing a film can include providing a film including a polycrystalline thin film having a top surface having a first surface roughness defined by a first plurality of protrusions and an oxide layer over the top surface of the thin film. The method can also include etching the film to substantially remove the oxide layer, irradiating a portion of the film using a short-pulse duration laser beam with controlled energy density to cause partial melting to the portion of the etched film form a self-leveling molten layer, cooling the self-leveling molten layer; and forming a modified thin film having a second surface roughness defined by a second plurality of protrusions wherein the second surface roughness is lower than the first surface roughness.

In accordance with certain embodiments, the excimer laser beam has a pulse duration of between 10 ns and 100 ns.

In accordance with certain embodiments, a system for processing a film can include a laser source configured to supply a sequence of laser pulses, laser optics that shape the laser beam into a line beam, the line beam having a fluence that is sufficient to melt at least a partial thickness of the film in an irradiated region, the film comprising a polycrystalline thin film having a top surface having a first surface roughness defined by a first plurality of protrusions and an oxide layer over the top surface of the thin film, a stage for supporting the film and configured to translate in at least one direction, a processor operably coupled to the laser source, and a memory. The memory can be operably coupled to the processor and storing a set of processor-issuable instructions that cause the processor to define a region of the film to be planarized, etch the film to substantially remove the oxide layer, and irradiate at least a portion of the etched film using a short-pulse duration laser beam with controlled energy density to cause partial melting to the portion of the etched film, to form an irradiated polycrystalline thin film having a second surface roughness defined by a second plurality of protrusions wherein the second surface roughness is lower than the first surface roughness.

BRIEF DESCRIPTION OF THE DRAWINGS

The above and other objects and advantages of the present disclosure will be apparent upon consideration of the following detailed description, taken in conjunction with the accompanying drawings, in which like reference characters refer to like parts throughout, and in which:

FIG. 1A is a block diagram illustrating an exemplary method of surface planarization, in accordance with some embodiments of the present disclosure.

FIG. 1B is a series of cross-sectional renderings of a thin film during the planarization method of FIG. 1A.

FIG. 9A is a combined plot showing the average roughnesses shown in FIGS. 6 and 8.

FIG. 9B is a combined plot showing the average roughnesses shown in FIGS. 7 and 8.

FIGS. 12A-12D are a series of cross-section renderings showing an irradiation-based planarization process using a short pulse duration beam, in accordance with some embodiments of the present disclosure.

FIGS. 13B-13E are a series of cross-section renderings showing an irradiation-based planarization process using a long pulse duration beam, in accordance with some embodiments of the present disclosure, and FIG. 13A is a corresponding AFM image of an exemplary treated surface.

DETAILED DESCRIPTION OF THE INVENTION

Figure 2A:
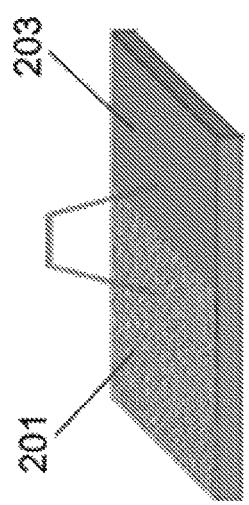
FIGS. 2A-2C illustrate aspects of a traditional ELA technique as applied to a silicon thin film.

Excimer laser annealing (ELA) of silicon films employs a long and narrow ultraviolet (UV) line beam to scan over the film in an overlapping manner (approximately 20 shots per point) to provide polycrystalline silicon films with approximately 300 nm grains, for example for thin-film transistor (TFT) applications. When a-Si films are crystallized via conventional ELA methods, the resulting polycrystalline films typically contain a high density of surface protrusions. These protrusions are formed, for example, due to localized mass accumulation of silicon during solidification of the polycrystalline silicon film. This may be due to non-uniformity in the silicon phase change and corresponding density change during solidification. These protrusions can be beneficial during conventional ELA since their ability to scatter the incident beam can contribute to the formation of uniform polycrystalline grains. However, because these protrusions are undesirable for TFTs, and with increasing needs to fabricate higher performance TFTs for future products, such as advanced active-matrix organic light-emitting diode (AMOLED) displays, an efficient solution to the protrusion problem is needed. A person of ordinary skill would understand that ELA processed films are used herein as examples of polycrystalline films. The disclosed methods can be applied to all polycrystalline films to reduce the protrusions of the films.

According to the disclosed systems and methods, partial melting of surfaces of ELA-processed silicon films using excimer laser irradiation can remove or reduce protrusions disposed thereon, thereby planarizing the films. According to aspects of the disclosure, melt-mediated planarization can be used for the post-processing of ELA-treated films, for example, utilizing the surface tension of a molten layer to planarize the protrusions for as long as the molten layer remains molten. In some embodiments, a pulsed excimer laser can be used to irradiate a surface, or portion thereof, of an ELA-processed film, such as a silicon thin film, to cause melting of the film surface. The energy density of the excimer laser beam can be controlled to be within a range in which only the film surface is molten into liquid, while the material underneath the film surface remains solid. According to aspects of the disclosure, the degree of melting of the silicon surface can be below the near-complete-melting threshold, e.g., there is no region in the film that has melted throughout the entire thickness of the film, to avoid the re-formation of protrusions and changes in the film microstructure. A person of ordinary skill in the art would understand the "near-complete-melting threshold" to define a state of a film where one or more regions of the film have completely melted throughout the thickness of the film, but the entire film is not completely melted. The laser irradiation can be performed once (e.g., in a single scan or a single pulse), for example, to reduce the height of the protrusions, or can be performed multiple times in succession, for example, to substantially eliminate them. In some embodiments, the ELA-processed silicon surface, or a portion thereof, can be irradiated with a short-pulse-duration, e.g., below 200 ns, or short pulse width laser beam. In some implementations, the laser energy density is selected to be approximately 80% of the complete melting threshold (CMT) energy of a film. When an ELA-processed silicon film is irradiated in accordance with some embodiments, a reduction of greater than 50% of the surface protrusions in the film, e.g., of the average height of protrusions, for a given area of treatment, can be achieved.

As used herein, the term "planarize" or "planarization" refers to the flattening or leveling of the referenced surface, the reduction of surface roughness, the removal or partial removal of surface features disposed thereon, and/or the like.

FIG. 1A is a block diagram illustrating a method of surface planarization, in accordance with certain embodiments, and FIG. 1B is a series of cross-sectional renderings of a thin film being processed according to the planarization method of FIG. 1A. In some embodiments, the method of surface planarization includes three steps: providing a thin film with protrusions, etching the thin film to remove an oxide, and irradiating the etched thin film to planarize it. As shown in the method 100 of FIG. 1A, a thin film, is provided at 102. The thin film can include polycrystalline silicon 130A or other polycrystalline film having a first plurality of protrusions "P" that define a first surface roughness of the thin film, and an oxide 120, for example a naturally-occurring passivation layer or "native oxide," such as silicon dioxide, as shown in the top image of FIG. 1B. A top surface of the thin film can comprise the oxide 120. The protrusions can be present, for example, as a result of a prior ELA crystallization process. Protrusions of the first plurality of protrusions can include silicon. The thin film can be disposed on a substrate 132, such as a silicon wafer or die. The thickness of the thin film can range from a single monolayer to several micrometers. The thin film can be an ELA-generated polycrystalline film (an "ELA thin film").

The top surface of the thin film can be etched 104 to form an etched surface. For example, the top surface of the thin film can have an oxide 120 that can be etched. The etching of the oxide can be performed using a wet chemical etch, such as a buffered hydrofluoric acid (BHA), and/or using a dry chemical etch, such as plasma etching. Plasma techniques for etching silicon dioxide can include reactive ion etching using hydrogen ($H_2$) and silane ($SiH_4$) gases, and plasma etching in a parallel-plate reactor using fluorine or chlorine-based plasmas. After oxide etching is completed, the etched thin film, as shown in the middle image of FIG. 1B, includes the polycrystalline silicon 130A with the first plurality of protrusions "P," but no oxide. By etching the top surface of the thin film, the top surface of the thin film can be, for example, free from oxide, substantially free from oxide, or partially reduced in oxide content. In other words, the etching can remove, or substantially remove, the oxide such that a top surface of the etched thin film comprises silicon. In some embodiments, the etched surface can include some or all of the protrusions that formed part of the initial top surface prior to etching.

The etched surface of the thin film can then be irradiated, for example, using an excimer laser beam, to planarize the etched surface and form an irradiated thin film 106. The irradiation of the surface can cause a superficial and, in some embodiments, partial, melting of the polycrystalline film. The irradiation can cause heat transfer to the etched surface, without substantially transmitting, heat to the substrate. In some embodiments, the irradiation can be performed using a pulsed excimer laser with a short pulse duration and a laser energy to cause partial melting below the near CMT. As a result of the irradiation, the plurality of protrusions of the second surface can be reduced, reshaped, smoothed, or eliminated. In other words, the irradiated thin film can have a second surface roughness that is defined at least by a second plurality of protrusions, such that the second surface roughness is lower than the first surface roughness. Protrusions of the second plurality of protrusions can comprise silicon. The degree of planarization of the thin film can depend upon one or more of: the irradiation pulse width, the laser energy used to irradiate the second surface, the number of pulses applied to the second surface during irradiation, the duty cycle of the laser, etc. After irradiation is completed, the irradiated thin film, as shown in the lowermost image of FIG. 1B, includes polycrystalline silicon 130B having a second plurality of protrusions that define a second surface roughness that is lower/less than the first surface roughness. The second plurality of protrusions can be at least one of: lower in quantity, lower in collective volume, lower in average height, or lower in average diameter than the first plurality of protrusions.

Figure 2B:
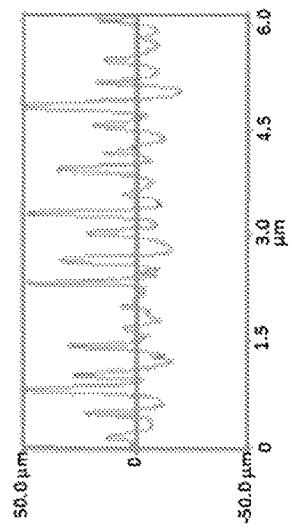
Figure 2C:
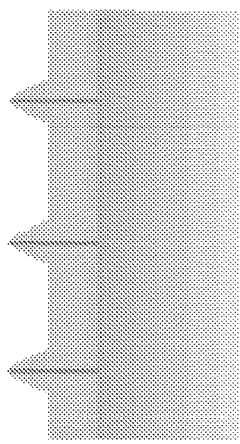

FIGS. 2A-2C illustrate aspects of a traditional ELA technique as applied to a silicon (Si) thin film. FIG. 2A shows a schematic of the ELA process. As shown in FIG. 2A, an amorphous silicon film 201 can be converted into a polycrystalline silicon film 203 via ELA. The initial, amorphous silicon film can be amorphous, for example, as a result of the way it was initially deposited, e.g., via physical vapor deposition or chemical vapor deposition. FIG. 2B shows a plot of surface roughness of a traditionally-prepared ELA-generated polycrystalline silicon film. The "x" axis is the scan length of AFM and the "y" axis is the height of the surface of each scanning point. FIG. 2C shows a rendering of a cross-section of a substrate having an ELA-generated polycrystalline silicon film disposed thereon, illustrating the relative magnitude of the size of the surface protrusions that arise via ELA processing.

Figures 3A, 3B, 3C, 3D:
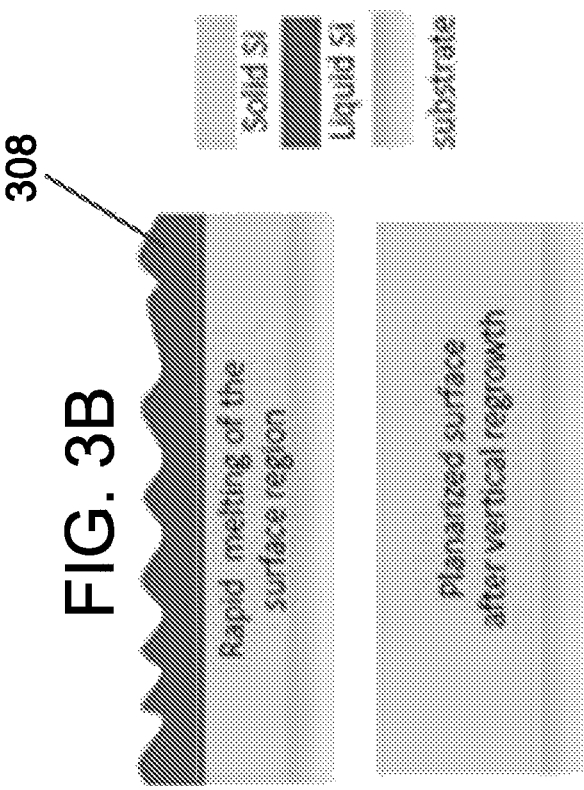
FIGS. 3A-3D are renderings of cross-sections of a silicon surface demonstrating a surface planarization method in accordance with some embodiments of the present disclosure.

FIGS. 3A-3D are renderings of cross-sections of a silicon surface demonstrating a surface planarization method in accordance with certain embodiments of the present disclosure. As shown in FIG. 3A, polysilicon 305 having a rough surface, such as the rough surface shown in FIG. 2E, is disposed on a substrate 307. The polysilicon's rough surface can be irradiated with an excimer laser to produce a surface melting, resulting on a layer of liquid silicon 308, as shown in FIG. 3B. FIG. 3C shows, the liquid layer, after having been irradiated, to have flattened due to surface tension. FIG. 3D shows that once the flattened liquid layer solidifies, the resulting film has a planarized surface instead of a rough surface.

Figure 4B:
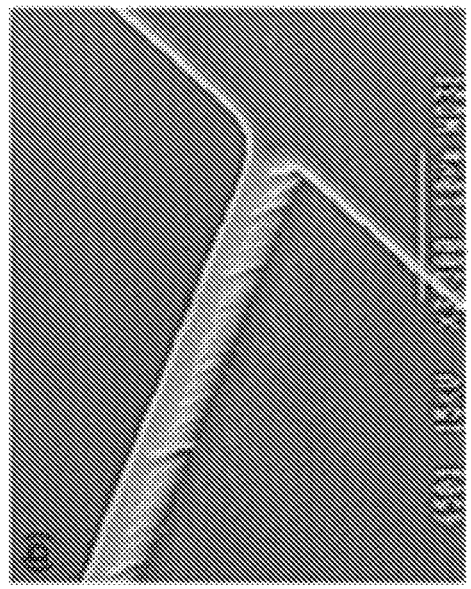
FIG. 4B is an AFM image of the silicon surface of FIG. 4A after irradiation.
Figure 4A:
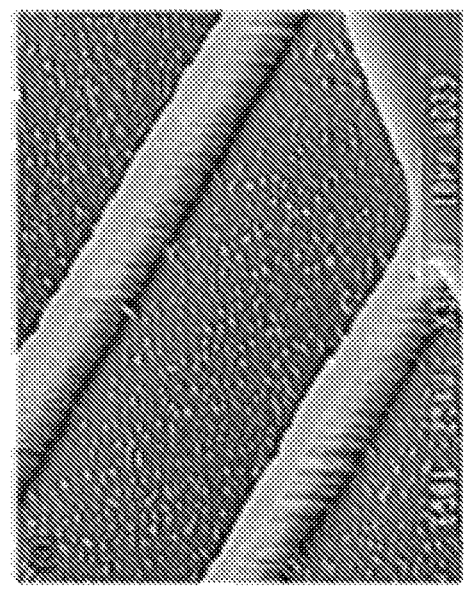
FIG. 4A is an atomic force microscope (AFM) image of a silicon surface before irradiation.

FIG. 4A is an atomic force microscope (AFM) image of a silicon surface before irradiation/annealing, and FIG. 4B is an AFM image of the silicon surface of FIG. 4A after excimer laser irradiation/annealing.

Figure 5:
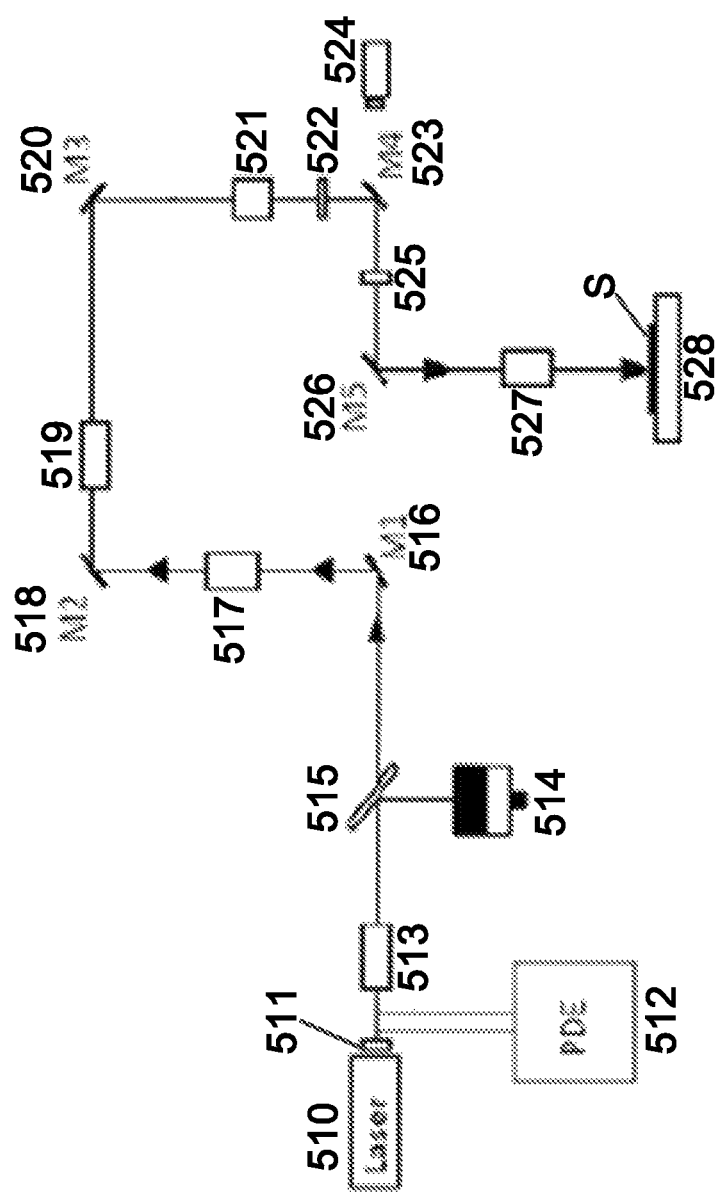
FIG. 5 is a schematic view of an experimental setup for performing laser irradiation induced surface planarization, in accordance with some embodiments of the present disclosure.

FIG. 5 is a schematic view of an exemplary experimental setup for performing laser irradiation induced surface planarization, in accordance with certain embodiments. FIG. 5 shows a laser 510 with shutter 511, attenuator 513, beam splitter 515, energy meter 514, mirror M1 516, beam-shaping telescope 517, mirror M2 518, homogenizer 519, mirror M3 520, field lens 521, mask 522, mirror M4 523, eye piece 525, mirror M5 526, 5× projection lens 527, mask-viewing charge-coupled device (CCD) 524, and x-y-z translation stage 528. As shown in FIG. 5, a laser 510, for example, a XeCl (308 nm, 30 ns) laser, can emit light via a shutter 511. The pulse of the light can be extended using pulse duration extender (PDE) 512. The emitted light can be attenuated via attenuator 513, and can be split at beam splitter 515. A portion of the attenuated light can be directed to an energy meter 514, which can monitor the laser energy. Another portion of the attenuated laser light can be directed to a first mirror M1, 516. Light arriving at mirror 516 can be reflected, for example, by 90°, and then can pass through a beam-shaping telescope 517. Beam-shaping telescope 517 can shape the beam into a line beam or other shape. Then the light can be reflected, for example, by 90°, by a second mirror M2, 518. The reflected light can pass through a homogenizer 519. The homogenizer 519 can homogenize the pulse, if the generated laser pulses are not uniform. After the light exits the homogenizer 519, is can be reflected, for example, by 90°, by a third mirror M3 520. The light reflected by mirror 520 can pass, sequentially, through a field lens 521 and a mask 522 before again being reflected 90° by a fourth mirror M4 523. Light reflected by mirror 523 passes through an eye piece 525 before again being reflected 90° by a fifth mirror M5 526. Light reflected by mirror 526 can pass through a 5× projection lens 527, which projects the light onto sample S, which is disposed on an x-y-z translation stage 528.

Using the apparatus described above with reference to FIG. 5, FIGS. 6A-8E show the results of a set of single-shot experiments (i.e., each area of the film is only irradiated once) on 50 nm ELA-processed films at various partial-melting energy densities under different combinations of irradiation and sample configurations. The illustrative experiments used a 308 nm XeCl excimer laser operating at a wavelength of about 30 nm full-width at half maximum (FWHM). The results of these experiments were analyzed in the following ways: (1) "as-ELA-processed" silicon films were compared with buffered hydrofluoric acid (BHF)-surface-etched ELA samples films; (2) silicon films irradiated in air were compared to silicon films irradiated in vacuum; (3) silicon films irradiated with a 30-ns pulse duration beam were compared with silicon films irradiated with an 8× higher pulse duration (240 ns) beam; and (4) silicon films that were front-side irradiated were compared to silicon films that were back-side irradiated. Pre-irradiation and post-irradiation surface protrusion characterizations were carried out using atomic force microscopy (AFM).

The results, discussed further in the Experiments section below, and with reference to FIGS. 6A-8E, indicate that an amount of melt-mediated surface planarization experienced by the protrusions can vary substantially depending upon several factors. For example, one factor is the removal of native surface oxide from the film surface prior to irradiation. The native oxide can reduce the thermodynamic driving force, as compared with bare silicon, as well as, can physically interfere with the mass transport and flow of the molten silicon layer. Additional factors can include the laser energy density, and the avoidance of re-creating "identical" hot spots resulting from scattering by the protrusions. Hot spots are regions in a molten film that take longer to solidify during cooling than other adjacent regions, and as such redistribute their volume out-of-plane, forming protrusions. Heterogeneous melting can take place during excimer-laser irradiation of polycrystalline silicon films, and/or as a result of periodic spatial variation in the protrusion heights found in conventional ELA-processed silicon films.

Experiments

Researchers have investigated, both experimentally and theoretically, the surface scattering of laser beams induced by the surface roughness of polycrystalline silicon, as well as the consequently non-uniform amounts of laser energy that is deposited as a result. For example, researchers have studied the optical properties of polycrystalline silicon with surface roughness, including polycrystalline silicon having grains with sizes comparable to the wavelength of an incident laser beam. Researchers have also studied the thermal dynamic and kinetic processes of phase transformations between liquid state and solid states for polysilicon. Scientists performing laser-assisted melting and resolidification of polysilicon with surface roughness should take both optical properties and intrinsic material properties into consideration.

Most recently, researchers have been studying pulsed excimer laser-induced melting and re-solidification of ELA-generated polysilicon thin films, because of the potential applicability of ELA films to the fabrication of active-matrix liquid-crystal display (AMLCD) and AMOLED backplanes for smart phones and large display panels.

According to aspects of the disclosure, a single-shot of irradiation from a pulsed excimer laser with relatively low energy was applied to samples comprising two different types of ELA-generated, small-grained polycrystalline silicon thin film, and the irradiation was performed in air for some samples, and under vacuum for others. The first type of film was an "as-processed" ELA-generated polycrystalline silicon thin film. The second type of film was an ELA-generated polycrystalline silicon thin film whose surface oxide had subsequently been etched using buffered hydrofluoric acid (BHF). All films were irradiated using a laser energy that is below the complete melting threshold of the film, i.e., an energy that partially melts the film. Based on the irradiation of these samples, observations were made about the induced melting and resolidification process.

Figure 6:
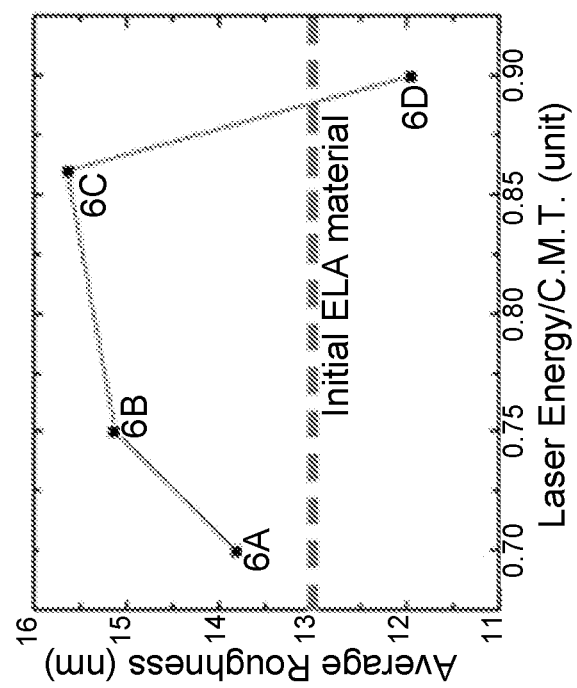
FIG. 6 is a plot of average roughness for each of the sample surfaces.

FIG. 6 is a plot of average roughness for sample surfaces of the first type film—the "as processed" ELA-generated polycrystalline silicon thin film after single-pulse irradiation in air. partial melting of the as-processed ELA-generated samples does not lead to planarization, and instead increased the roughness of the respective samples with respect to the initial ELA-generated starting material (see horizontal dashed line in FIG. 6).

As used herein, reductions in "average roughness" or "roughness" can generally correlate to reductions in at least one of: quantity, collective volume, average height, and average diameter of protrusions in the thin film being measured.

Figure 7:
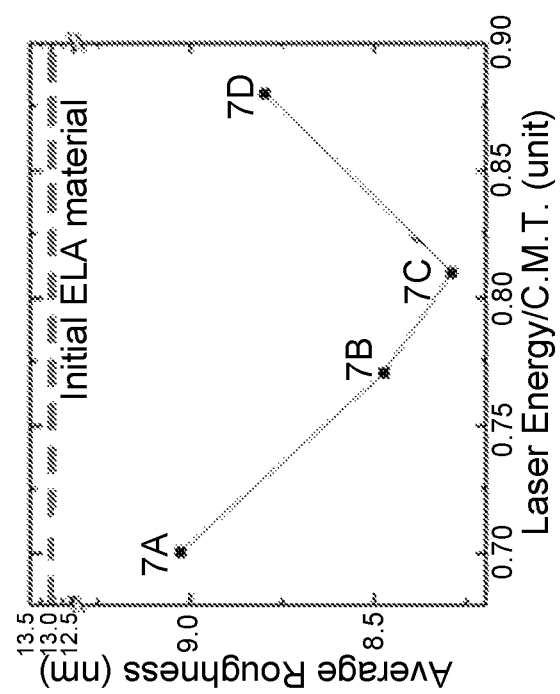
FIG. 7 is a plot of average roughness for each of the sample surfaces.

FIG. 7 is a plot of average roughness for each of the sample surfaces of the second type film—the ELA-processed and BHF-etched silicon surface—after single-pulse irradiation in air at varying laser energies, in accordance with certain embodiments. The surface roughness of each BHF-etch film can decrease after irradiation (see horizontal dashed line in FIG. 7, corresponding to the surface roughness of the initial ELA-generated and BHF-etched starting material). As such, the presence or absence of a native oxide on the surface of polysilicon was determined to play an important role in surface morphology development during the melting and resolidification process. The degree of planarization was found to depend on the incident laser energy density, and the maximum planarization was achieved at around 80% of the CMT value.

Figure 8:
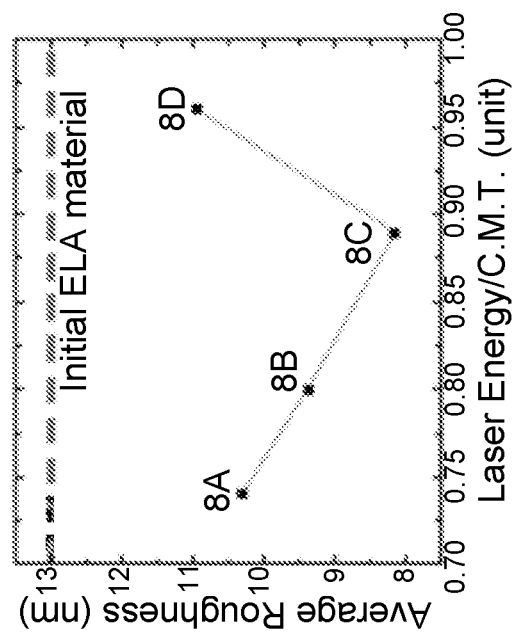
FIG. 8 is a plot of average roughness for each of the sample surfaces.

FIG. 8 is a plot of average roughness for each of the sample surfaces of the second type of film—the ELA-processed and BHF-etched silicon surface—after single-pulse irradiation in vacuum at varying laser energies, in accordance with certain embodiments. The surface morphology changes, and pattern thereof, for the BHF-etched samples irradiated under vacuum can be similar to the BHF-etched samples of FIGS. 7A-7D, which were irradiated in air.

The foregoing experimental results illustrate that the melting mechanisms varied for different laser energies. In addition, one-dimensional melting generally happened in the surface normal direction for relatively lower laser energy (e.g., a laser energy/C.M.T. of about 0.7) conditions, while two-dimensional melting, both on the surface and on grain boundaries, was observed for relatively higher amounts of laser energy (e.g., a laser energy/C.M.T. of about 0.96) deposited.

FIG. 9A is a combined plot showing the average roughnesses shown in FIGS. 6E and 8E. As shown in FIG. 9A, after irradiation under partial melting conditions, the surface roughness decreased only for the BHF-etched samples, while it increased for the as-processed samples. Since the primary consequence of the BHF treatment step is the removal of the oxide layer (native or otherwise), it is likely that the surface oxide layer, when present, prevents planarization.

FIG. 9A is a combined plot showing the average roughnesses shown in FIGS. 7E and 8E. As shown in FIG. 9A, planarization in air and in vacuum yielded similar results. The highest degree of planarization (i.e., the largest reduction in surface roughness) was achieved at about 80% of the CMT energy density values. The highest degree of planarization was found to correspond to about a 40% reduction in root-mean-square (RMS) roughness.

Figure 10A:
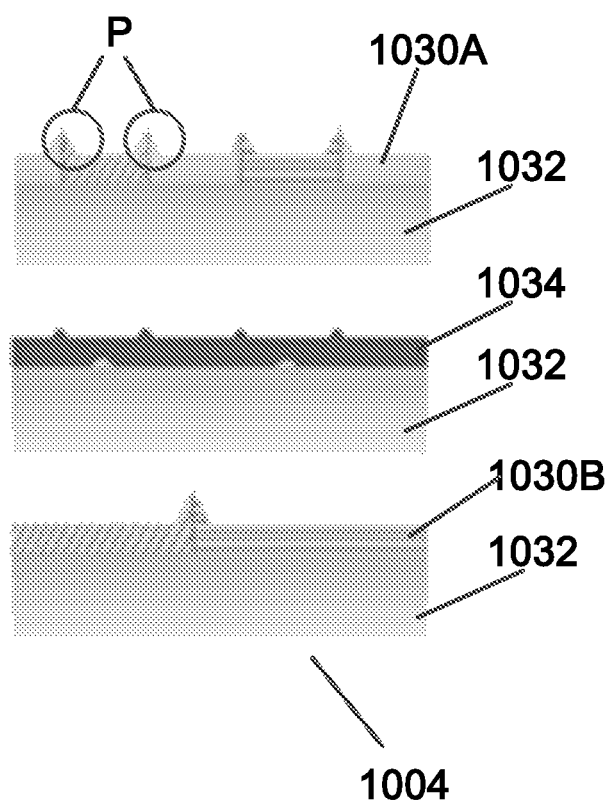
FIG. 10A illustrates exemplary cross-sectional renderings of the treatment process that produced the surface shown in the AFM image, in accordance with some embodiments of the present disclosure.
Figure 10B:
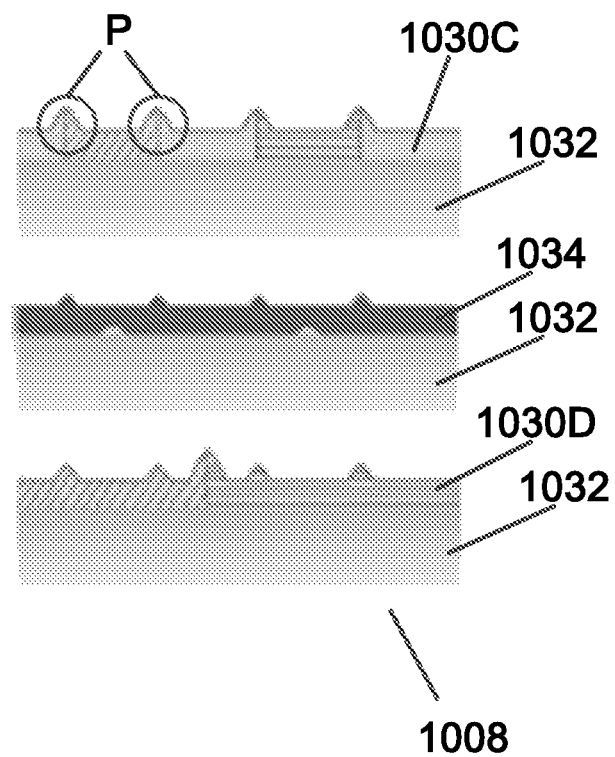
FIG. 10B illustrates exemplary cross-sectional renderings of the treatment process that produced the surface shown in the AFM image, in accordance with some embodiments of the present disclosure.

FIGS. 10A and 10B illustrate irradiation of ELA-processed silicon films, with and without oxide etch beforehand (respectively), in which the irradiation fully or substantially fully melts the corresponding silicon film. FIG. 10A illustrates cross-sectional renderings 1004 of the treatment process that produced the surface shown in the AFM image. The etching of oxide from the silicon surface was performed using BHF in the manner discussed above. The irradiation was performed using a laser energy density that is below the super lateral growth ("SLG")/near-complete melting energy density window. As shown in the cross-section renderings 1004, starting at the top, a solid polycrystalline layer 1030A includes grains having a first size and a plurality of protrusions "P" each disposed atop a corresponding grain boundary. The layer 1030A is disposed on a substrate 1032, and has been BHF-etched. During irradiation, a liquid layer 1034 is formed on the substrate 1032 and the protrusions can be seen to decrease in height and volume. The liquid layer 1034 can comprise the entirety of the silicon of layer 1030A, fully melted, or can comprise a partially melted layer including a portion of the silicon of layer 1030A. Once the liquid layer 1034 is subsequently solidified and recrystallized, a new solid polycrystalline surface 1030B results, in which the grains are larger, and which includes fewer protrusions (disposed atop corresponding grain boundaries which are newly-formed). In some instances, the protrusions of the new solid surface 1030B are larger, for example in volume, height, or other dimension, than the protrusions of layer 1030A, but these larger protrusions can be more localized. The smooth surface morphology of the interior of large SLG grains in 1030B indicates that completely melted regions underwent planarization.

FIG. 10B illustrates exemplary cross-sectional renderings 1008 of the treatment process that produced the surface shown in the AFM image. As shown in the cross-section renderings, starting at the top, a solid polycrystalline layer 1030C includes grains having a first size and a plurality of protrusions each disposed atop a grain boundary. The layer 1030C is disposed on a substrate 1032. During irradiation, a liquid layer 1034 is formed on the substrate 1032 and the protrusions can be seen to decrease in height and volume. However, once solidified and recrystallized, a new solid surface 1030D results, in which the grains are larger, but a larger number of protrusions, including protrusions disposed atop the newly-formed grain boundaries, are present on the surface of 1030D. In other words, small protrusions (~308 nm spaced) were observed well within the interior of the large SLG grains, and they appear to have persisted from the original ELA-generated surface, for example due to a reduction in driving force and/or retarding of the mass transport and flow capability of the molten silicon layer, as compared with bare silicon, caused by the native oxide.

Figure 11:
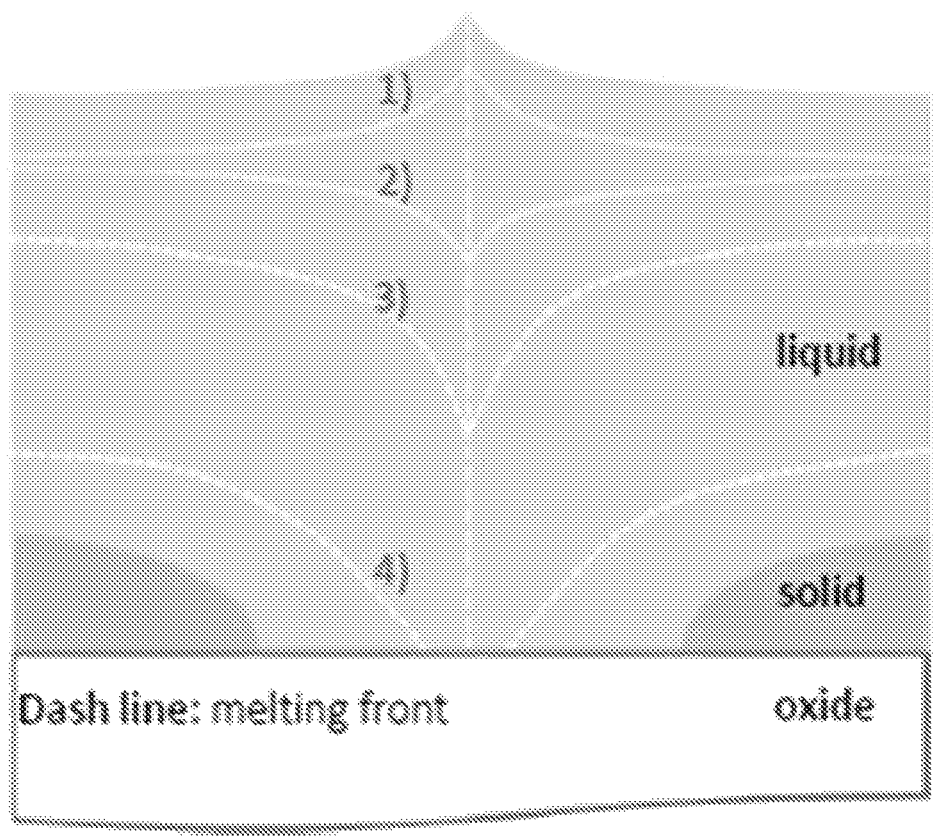
FIG. 11 is a cross-sectional rendering of a silicon sample, illustrating melting fronts along grain boundaries of the silicon, in accordance with embodiments of the present disclosure.

As illustrated in FIGS. 10A and 10B, after the solidification and recrystallization of the liquid layer 1034, which is formed after solid polycrystalline layers 1030A (FIG. 10A) and 1030C (FIG. 10B) fully or substantially fully melt, a large number of protrusions appear on the surface of the film. A possible mechanism for the formation of the protrusions atop newly-formed grain boundaries of FIGS. 10A and 10B, which impacts the overall degree of planarization achievable for a given irradiation process, is now discussed. FIG. 11 is a cross-sectional rendering of a silicon sample, illustrating melting fronts along grain boundaries thereof, in accordance with certain embodiments. The melting fronts are represented by dashed lines. Enhanced melting, as shown in FIG. 11, is believed to occur at random high-angle grain boundaries, leading to a non-planar solid-liquid interface. This non-planar solid-liquid interface leads, in turn, to localized re-accumulation of the mass at the last-place-to-freeze/subsequently reformed grain boundaries. The interface between solid silicon and oxide, however, is relatively melt-resistant by comparison. The local temperature $T_e$ can be defined by the following equation:

$$T^e_{local} = T_{mp} - T_{mp} \frac{2\sigma_{x-1}}{\Delta H_f} \rho_{local} \qquad (1)$$

In the equation above, Tmp is the melting temperature of bulk Si. σ is the local stress, Hf is the enthalpy difference from bulk Si, ρ is the local curvature.

In contrast to the processes illustrated in connection with FIGS. 10A and 10B, FIGS. 12A-12D are a series of cross-section renderings showing an irradiation-based planarization process using a short pulse duration beam, e.g., 200 ns, in accordance with certain embodiments. As shown in FIG. 12A, a starting polycrystalline silicon film has protrusions aligned with corresponding grain boundaries of the starting film. In FIG. 12B, during short pulse duration irradiation of the polycrystalline film surface, a partially molten layer is formed, with a substantially uniform thickness except at the locations where the grain boundaries had existed, where the molten layer thickness is greater. At FIG. 12C, during cooling (post-irradiation), the silicon surface is substantially planarized, with molten silicon in the original grain boundary locations being the last to re-solidify. Upon full re-solidification, corresponding protrusions result, which are reduced in size compared to the original protrusions and coincident with newly-formed grain boundaries, as shown in FIG. 12D. When using an ultra-short pulse duration beam, a substantially higher vertical temperature gradient is imparted to the irradiated film during the heating phase, resulting in a highly planar melting interface and, accordingly, a highly planarized final surface. According to aspects of the disclosure, planarization of up to about 40% of the starting film surface has been achieved using short pulse duration irradiation.

By contrast, FIGS. 13B-13E are a series of cross-section renderings showing an irradiation-based planarization process using a longer pulse duration beam (about eight times longer than the short pulse duration of FIGS. 12A-12D), in accordance with certain embodiments, along with a corresponding AFM image of an exemplary treated surface. As shown in FIG. 13B, a starting polycrystalline silicon film has protrusions aligned with corresponding grain boundaries of the starting film. At FIG. 13C, during longer pulse duration irradiation of the polycrystalline film surface, some portions of the film are partially melted, while other portions of the film, at the locations where the grain boundaries had existed, are fully molten, down to the substrate-film interface. At FIG. 13D, during cooling (post-irradiation), molten silicon in the original grain boundary locations is again the last to re-solidify, and its volume is vertically displaced by the newly-forming crystallites, resulting in the formation of corresponding new protrusions upon resolidification, as shown in FIG. 13E. According to some methods described herein, a longer pulse duration resulted in a planarization of about 14% with respect to the starting film.

Upon review of the description and embodiments provided herein, those skilled in the art will understand that modifications and equivalent substitutions may be performed in carrying out the invention without departing from the essence of the invention. Thus, the invention is not meant to be limiting by the embodiments described explicitly above.

What is claimed is:

1. A method, comprising:
    providing a film comprising:
        a polycrystalline thin film having a top surface having a first surface roughness and a first plurality of protrusions; and
        an oxide layer over the top surface of the thin film;
    etching the film to remove the oxide layer; and
    irradiating a portion of the etched film using a short-pulse duration laser beam with controlled energy density to cause partial melting to the portion of the etched film, to form an irradiated polycrystalline thin film having a second surface roughness and a second plurality of protrusions wherein the second surface roughness is lower than the first surface roughness.

2. The method of claim 1, wherein the film is an excimer laser annealed (ELA) film.

3. The method of claim 1, wherein the portion of the etched film is irradiated using at least one of an excimer laser, a solid-state laser, a rapidly scanned continuous wave laser, and a rapidly scanned quasi-continuous wave laser that provides laser energy to cause partial melting to the polycrystalline thin film below the near complete melting threshold.

4. The method of claim 1, wherein the irradiating comprises directing a single pulse of the laser beam toward the etched film.

5. The method of claim 1, wherein the irradiating comprises directing a plurality of pulses of the laser beam toward the etched film.

6. The method of claim 1, wherein the oxide layer is at least one of a deposited oxide and a native oxide.

7. The method of claim 1, wherein the second surface roughness is at least 50% lower than the first surface roughness.

8. The method of claim 1, wherein the second surface roughness is at least 10% lower than the first surface roughness.

9. The method of claim 1, wherein the second surface roughness is lower than about 50 nm.

10. The method of claim 1, wherein etching the film to remove the oxide layer comprises exposing the film to hydrofluoric acid (HF).

11. The method of claim 1, wherein etching the film to remove the oxide layer comprises exposing the film to a plasma.

12. The method of claim 1, wherein the excimer laser beam has a pulse width of no more than 200 ns.

13. A method, comprising:
    providing a film comprising:
        a polycrystalline thin film having a top surface having a first surface roughness and a first plurality of protrusions; and
        an oxide layer over the top surface of the thin film;
    etching the film to remove the oxide layer;
    irradiating a portion of the film using a short-pulse duration laser beam with controlled energy density to cause partial melting to the portion of the etched film to form a self-leveling molten layer;
    cooling the self-leveling molten layer; and
    forming a modified thin film having a second surface roughness and a second plurality of protrusions wherein the second surface roughness is lower than the first surface roughness.

14. The method of claim 13, wherein the film is an excimer laser annealed (ELA) film.

15. The method of claim 13, wherein the excimer laser beam has a pulse duration of between 10 ns and 100 ns.

16. The method of claim 13, wherein the portion of the etched film is irradiated using at least one of an excimer laser, a solid-state laser, a rapidly scanned continuous wave laser, and a rapidly scanned quasi-continuous wave laser that provides laser energy to cause partial melting to the polycrystalline thin film below the near complete melting threshold.

17. The method of claim 16, wherein the oxide layer is at least one of a deposited oxide and a native oxide.

18. The method of claim 13, wherein etching the film to remove the oxide layer comprises exposing the film to hydrofluoric acid (HF).

19. The method of claim 13, wherein etching the film to remove the oxide layer comprises exposing the film to a plasma.

20. The method of claim 13, wherein the modified thin film is a polycrystalline thin film.

* * * * *